United States Patent [19]
Henley

[11] Patent Number: 5,465,052
[45] Date of Patent: Nov. 7, 1995

[54] METHOD OF TESTING LIQUID CRYSTAL DISPLAY SUBSTRATES

[75] Inventor: Francois J. Henley, Los Gatos, Calif.

[73] Assignee: Photon Dynamics, Inc., Milpitas, Calif.

[21] Appl. No.: 757,460

[22] Filed: Sep. 10, 1991

[51] Int. Cl.⁶ ............................. G01R 31/02; G09G 3/36
[52] U.S. Cl. ............................ 324/770; 324/753; 345/87
[58] Field of Search ..................................... 324/770, 753, 324/96, 501, 752; 382/8; 345/87

[56] References Cited

U.S. PATENT DOCUMENTS

| | | | |
|---|---|---|---|
| 3,992,663 | 11/1976 | Seddick | 324/52 |
| 4,242,635 | 12/1980 | Burns | 324/158 |
| 4,355,278 | 10/1982 | Burns et al. | 324/158 |
| 4,368,523 | 1/1983 | Kawate | 365/63 |
| 4,444,801 | 4/1984 | Hongo et al. | 427/10 |
| 4,463,073 | 7/1984 | Miyauchi et al. | 430/5 |
| 4,465,969 | 8/1984 | Tada et al. | 324/96 |
| 4,507,605 | 3/1985 | Geisel | 324/73 |
| 4,510,222 | 4/1985 | Okunaka et al. | 430/5 |
| 4,523,847 | 6/1985 | Bjorklund et al. | 356/349 |
| 4,542,333 | 9/1985 | Koontz | 324/52 |
| 4,563,093 | 1/1986 | Tada et al. | 356/368 |
| 4,618,819 | 10/1986 | Mourou et al. | 324/77 |
| 4,631,576 | 12/1986 | St. John | 358/65 |
| 4,633,242 | 12/1986 | Sekiya | 340/719 |
| 4,636,403 | 1/1987 | Fisanick et al. | 427/53 |
| 4,688,900 | 8/1987 | Doane et al. | 350/347 |
| 4,727,234 | 2/1988 | Oprysko et al. | 219/121 |
| 4,758,092 | 7/1988 | Heinrich et al. | 356/36 |
| 4,776,022 | 10/1988 | Fox et al. | 382/8 |
| 4,819,038 | 4/1989 | Alt | 357/4 |
| 4,825,201 | 8/1989 | Watanabe et al. | 340/717 |
| 4,855,591 | 8/1989 | Nakamura et al. | 250/225 |
| 4,862,075 | 8/1989 | Choi et al. | 324/158 |
| 4,868,492 | 9/1989 | Beha et al. | 324/73 |
| 4,870,357 | 9/1989 | Young et al. | 324/770 |
| 4,875,006 | 10/1989 | Henley et al. | 324/158 |
| 4,899,105 | 2/1990 | Akiyama | 324/158 |
| 4,906,922 | 3/1990 | Takahashi et al. | 324/158 |
| 4,910,458 | 3/1990 | Forsyth et al. | 324/158 |
| 4,944,576 | 7/1990 | Lacker et al. | 350/334 |
| 4,983,911 | 1/1991 | Henley | 324/158 |
| 4,999,577 | 3/1991 | Beha et al. | 324/158 |
| 5,017,755 | 5/1991 | Yahagi et al. | 219/121 |
| 5,037,683 | 7/1991 | Takahashi et al. | 324/158 |
| 5,043,297 | 8/1991 | Suzuki et al. | 437/51 |

FOREIGN PATENT DOCUMENTS

| | | |
|---|---|---|
| 3111393A1 | 9/1982 | Germany . |
| 55-56330 | 11/1981 | Japan . |
| 56-58893 | 11/1981 | Japan . |

OTHER PUBLICATIONS

System Tests Devices at GHz Rates, Lyle H. McCarty, Design News, Apr. 10, 1989.
Electro–Optic Device Tester Tops 1 GHz, John Novellino, Electronic Design, Sep. 8, 1988.
An Ultra High Speed Test System, Francois J. Henley, (List continued on next page.)

*Primary Examiner*—Ernest F. Karlsen
*Attorney, Agent, or Firm*—Townsend and Townsend and Crew

[57] ABSTRACT

Construction defects in liquid crystal display base plates are detected by placing an electro-optical element, in which the optical properties change when an electric field is applied thereto, over and facing a liquid crystal display base plate, energizing the leads of said display base plate, irradiating the base plate with a light beam through the electro-optical element, and converting the optical changes detected for each pixel element electrode into a voltage distribution. The testing method in this invention is capable of identifying not only whether or not a pixel element electrode is functional, but also if a functional pixel element electrode is functioning as desired or not. Application of the testing method of this invention is able to test liquid crystal display base plates, including those which show ambiguous display irregularities. Electro-optical elements change their optical properties when an electrical field is applied thereto.

19 Claims, 7 Drawing Sheets

OTHER PUBLICATIONS

IEEE Design & Test of Computers, Feb. 1989.

Electro–Optic Technology Supports Gigahertz Speeds; Francois J. Henley, Electronics Test, Sep. 1988.

Using Electro–Optic Sampling Technology For Accurate Gigahertz ATE: Overview Of The Art, Francois J. Henley, 1990 IEEE VLSI Test Symposium.

High Speed Pattern Generator And GaAs Pin Electronics For a Gigahertz Production Test System, D. J. Kratzer, S. Barton, F. J. Henley D. A. Plomgrem, Proceedings of IEEE 1988 Int'l Test Conf, Sep. 1988.

Test Head Using Electro–Optic Receivers And GaAs Pin Electronics For A Gigahertz Production Test System, F. J. Henley, H. J. Choi, Proceedings of IEEE 1988 Int'l Test Conference, Sep. 1988.

Achieving ATE Accuracy At Gigahertz Test Rates: Comparison of Electronic And Electro–Optic Sampling Technologies, F. J. Henley, H. J. Choi, Int'l Test Conf. Aug., 1989.

Systems Solutions Based On Electro–Optic Sampling To High Speed IC Test Problems, F. J. Henley, D. B. MacDonald, SPIE vol. 795 Characterization Of Very High Speed Semiconductor Devices & Integrated Circuits (1987) pp. 345–351.

Characterization of High Speed (Above 500 MHz) Devices Using Advanced ATE—Techniques, Results And Device Problems, S. Barton, Proceedings Of The IEEE 1989, Int'l Test Conf., Aug. 1989.

In–Process Testing Of Thin Film Transistor Arrays; R. Wisnieff et al.; SID 90 Digest pp. 190–193.

NCAP Displays: Optical Switching And Dielectric Properties; L. Welsh et al.; SID 90 Digest; pp.220–223.

Testing And Qualifications Of A–Si TFT–LC Color Cells For Military Avionics Applications; F. C. Luo et al.; SID 90 Digest; pp. 194–196.

Hitachi LCD Advertisement; pp. 2 and 3.

Measurement Of Electro–Optic Characteristics Of LCDs; M. E. Becker et al.; SID 90 Digest; pp. 163–166.

Testing and Qualifications Of A Si TFT–LC Color Cells For Military Avionics Applications; F. C. Luo et al; SID 90 Digest; pp. 194–196 Oct. 14, 1994.

METHOD OF TESTING LIQUID CRYSTAL DISPLAY SUBSTRATES

BACKGROUND OF THE INVENTION

This invention relates to a testing instrument which detects defects in liquid crystal display base plates that are used for liquid crystal display panels, and the like.

When the area and the density of a liquid crystal display panel are to be greatly increased to be suitable for use in a liquid crystal TV, advantage lies in active matrix type liquid crystal display panels. These panels utilize active matrix liquid crystal display base plates further comprising multiple pixel element electrodes installed for each of the pixel elements. The elements are arranged in lines, with gate and source leads installed on each of the pixel element electrodes, and thin film transistors. Commercialization began with relatively small size devices. Typically, liquid crystal display panels of this type are manufactured using an active matrix liquid crystal display base plate, and a transparent base plate, which is placed over the active matrix liquid crystal display base plate and separated by a spacer, then liquid crystal material is sealed in the space between the active matrix liquid crystal display base plate and the transparent base plate.

Many liquid crystal televisions or displays currently in production employ liquid crystal display panels which have 250,000 to 500,000 pixel elements, and some with over 1,000,000 pixel elements.

To build such a large number of pixel elements and the corresponding number of leads on a base plate, various film forming processes are performed inside a clean room where dust is kept at an extremely low level. When the width of the pixel element and the lead is extremely small, presence of trace amounts of micro-dust in the manufacturing environment is directly related to breakage or short-circuit of the pixel element electrodes, gate leads, and source leads. At present, up to 10 of those defects are accepted on an active matrix liquid crystal display base plate, but the product is considered defective if it exceeds this limit.

Present manufacturing technology, however, finds it difficult to reduce these defects within the allowable limit. Consequently, liquid crystal display panels produced with a large number of pixel elements have a high ratio of defective panels, causing high prices of large liquid crystal panels.

Testing methods utilizing mechanical probes have been used to test active matrix liquid crystal display base plates, upon completion. However, because the number of the elements on an active matrix liquid crystal display base plate has become so large that this technique requires a lengthy testing process, and is hence impractical.

No in-line testing has traditionally been conducted on active matrix liquid crystal display base plates until they are completed. A visual check is executed by energizing the finished liquid crystal display panels to verify actual functioning of each pixel element. Defects discovered at this point are difficult and expensive to correct causing the defective products to be disposed of. This is a major cause of the poor yield of active matrix liquid crystal displays.

To solve this problem, a detecting beam is irradiated onto the electro-optical element with an electrical field applied to each pixel element electrode, and the changes in the optical properties of the detecting beam with respect to each pixel element electrode are captured by a camera. The optical changes are converted into a voltage reading for each pixel element, and when the voltage distribution for each pixel element electrode is obtained, defects in the pixel element electrodes, gate leads, source leads, and in other parts on the liquid crystal display base plate which cause display irregularities of the pixel elements, resulting in abnormalities in the voltage distribution, thus detecting the display irregularities of the pixel element electrodes, and therefore, defects are detected.

SUMMARY OF THE INVENTION

In order to solve this problem, a testing method for liquid crystal display base plates with thin layer transistors, and having multiple gate leads, multiple source leads, and multiple pixel element electrodes formed thereon was developed. This testing method detects the defects in liquid crystal display base plates by placing an electro-optical element in which the optical properties change when an electrical field is applied thereto, directly over and facing said liquid crystal display base plate with an extremely small gap separating the two. Energizing the gate and source leads causes each pixel element electrode of the liquid crystal display base plate to apply an electrical field to the electro-optical element. Irradiating the electro-optical element and capturing the changes in the optical properties thereof for each pixel element electrode by a photo-receiver, converting the optical changes captured by said photo-receiver into a voltage measurement for each pixel element electrode, then analyzing the distribution of the converted pixel element electrode voltages results in an accurate test of the integrity of the gate and source leads.

The object of the present invention is to create a testing method capable of sure and quick detection of the defects of liquid crystal display base plates of the active matrix type prior to the assembly of liquid crystal panels, and to allow easy identification of the defects caused by ambiguous malfunctioning of each pixel element electrode.

DESCRIPTION OF A PREFERRED EMBODIMENT

Figure 1A:
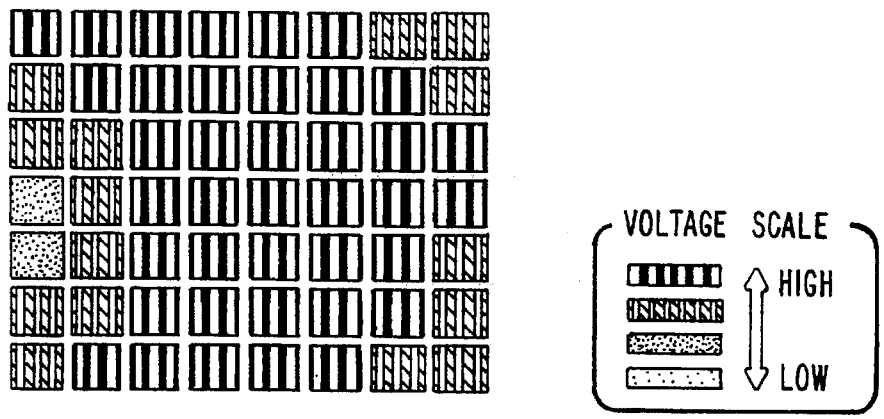
FIG. 1(a) is a diagram showing one example of the brightness status of the pixel element electrodes to be tested by the testing method of this invention.
Figure 1B:
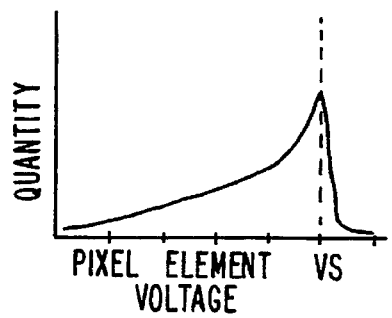
FIG. 1(b) is a voltage distribution graph which corresponds to the pixel element electrodes shown in FIG. 1(a)
Figure 2:
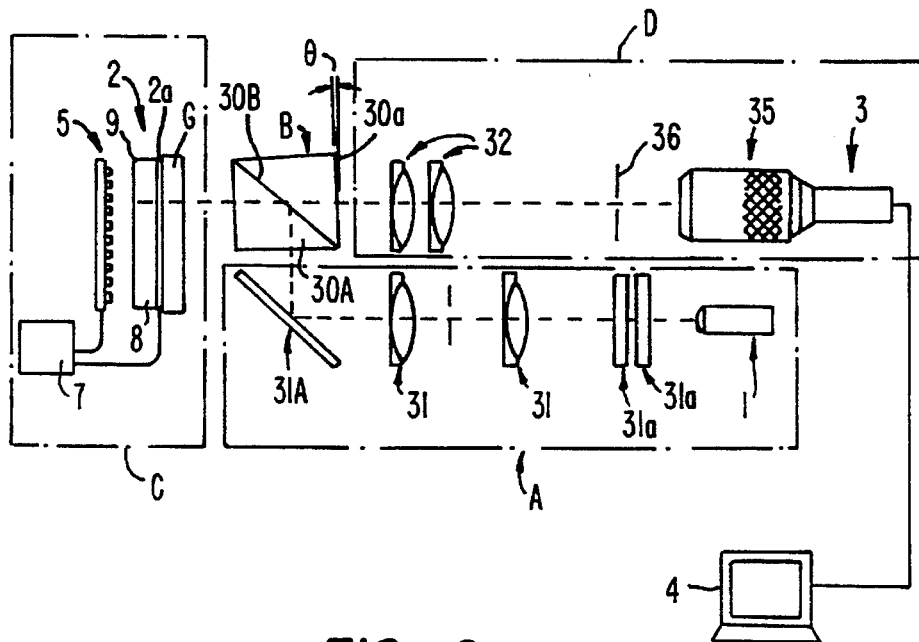
FIG. 2 is a configuration diagram which shows a construction outline of the main portion of one example testing instrument used in this invention.

FIG. 1(a) and 1(b) show a comparison between the brightness of the pixel element electrodes of a liquid crystal display base plate and the voltage distribution thereof, which have been obtained by application of this invention. To obtain the voltage distribution indicated in FIG. 1(b), a testing instrument as outlined in FIG. 2 is used. The testing instrument comprises lighting device A with light source 1 to emit scanning light. Light guide B directs the light emitted by lighting device A. Detecting device C with electro-optical element 2 into which the detecting beam from light guide B enters, is followed by imaging device D with photo-receiver 3 to receive the light reflected by electro-optical element 2. Monitor 4 is connected to photo-receiver 3. Detecting device C is constructed so that liquid crystal display base plate 5 of the active matrix type, or the like can be placed facing electro-optical element 2.

Figure 3:
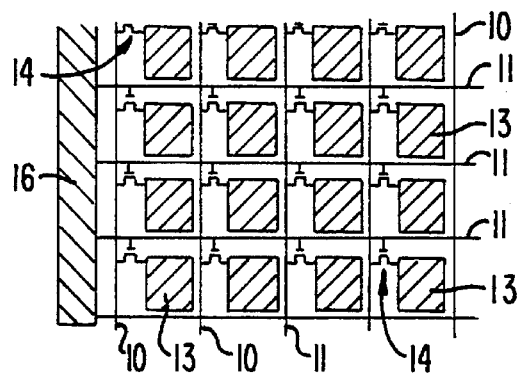
FIG. 3 is an enlargement of an active matrix liquid crystal display base plate which is tested by said instrument.

Liquid crystal display base plate 5 is a well known product used for liquid crystal display panels. As shown in FIG. 3, liquid crystal display base plate 5 comprises multiple source leads 10 for sending the data signals and multiple gate leads 11 for sending the scanning signals, both of which are formed in lines on the base plate. Pixel element electrodes 13 are arranged therebetween with connection to source leads 10 and gate leads 11 via switching elements 14 (thin layer transistors).

Many different configurations of the leads, pixel element electrodes, and switching elements of liquid crystal display base plate 5 are known. Any configuration can be applied to the method of this invention, and therefore the configuration or structure of the liquid crystal display base plate is not restricted.

In FIG. 3, number 15 indicates a shorting bar (short-circuit electrode) connected to source leads 10. Number 16 indicates a shorting bar (short-circuit electrode) connected to gate leads 11. Shorting bars 15 and 16 are present at the time of the manufacturing stage of liquid crystal display base plate 5, but are cut and removed upon manufacture of liquid crystal display base plate 5 and during the subsequent processes, including the placement of transparent base plates on the liquid crystal display base plates, and the production of liquid crystal display panels by way of sealing liquid crystal in between.

Shorting bars 15 and 16 are installed to prevent static electricity from adversely affecting the thin film transistors. The testing method of this invention is applicable even if actual drivers are installed instead of the shorting bars.

Light source 1 in the testing instrument in the preferred embodiment is a halogen light, but laser beams of various kinds may be used instead of the halogen lamp as light source 1. The laser beams, however, will produce fine speckles of light on the surface of electro-optical element 2 when irradiated as a detecting beam onto electro-optical element 2. The speckles may be detected as noise to produce what is known as speckle noise. For this reason, it is preferred to use a halogen light.

Electro-optical element 2 is made of liquid crystal sheet or Pockels crystalline plate which changes its optical properties when an electrical field is applied. Electro-optical element 2 shown in FIG. 2 is made of liquid crystal sheet 8 having liquid crystal sealed inside the transparent casing and an optically reflective part 9 such as dielectric multilayer film formed or bonded on the bottom thereof. In FIG. 2, letter G is a transparent glass plate installed on the top surface of electro-optical element 2.

Liquid crystal sheet 8, consists of NCAP (Nematic Curvilinear Aligned Phase), PDLC, PN-LC or other material which changes its light transmissivity in proportion with the magnitude of the electric field created across liquid crystal sheet 8. Liquid crystal suitable to be sealed in liquid crystal sheet 8 should be of a type wherein the liquid crystal in water droplet form dispersed in a macromolecule such as a polymer. By adjusting the size of the droplets of the macromolecule containing the liquid crystal, the liquid crystal exhibits transparency/nontransparency to ON/OFF of the electric field due to match or mismatch in the refractive indexes of the macromolecule and the liquid crystal (PN-LC). Another type of electro-optical element 2 is a Pockels crystal which changes the magnitude of polarization of the reflected light depending on the magnitude of applied electrical field.

Electro-optical element 2 used in this invention is not limited to the materials mentioned above, but it may be of any material so long as its optical properties including light transmissivity and polarization of reflected light, change at a constant-ratio to application of the electric field.

Photo-receiver 3 may be a CCD camera, etc. Use of a CCD camera eliminates the need for mechanically scanning the testing area, thus improving the process speed.

Number 7 in FIG. 2 indicates a voltage source which can apply a constant voltage between thin transparent electrode 2a at the upper portion of electro-optical element 2 and active matrix liquid crystal display base plate 5. This voltage source is also capable of applying separate pulsed voltages to the leads connected to the source and the gate leads. The pulse voltage, pulse width, and the frequency thereof can be controlled and changed. Voltage source 7 is equipped with a switch and a power source and connected electrically, as shown in FIG. 4, to thin layer transparent electrode 2a at the upper portion of electro-optical element 2 and shorting bars 15 and 16 of active matrix liquid crystal display base plate 5, thus enabling it to apply voltage to all pixel element electrodes 13 on active matrix liquid crystal display base plate 5 by way of the gate and the source leads.

Figure 4:
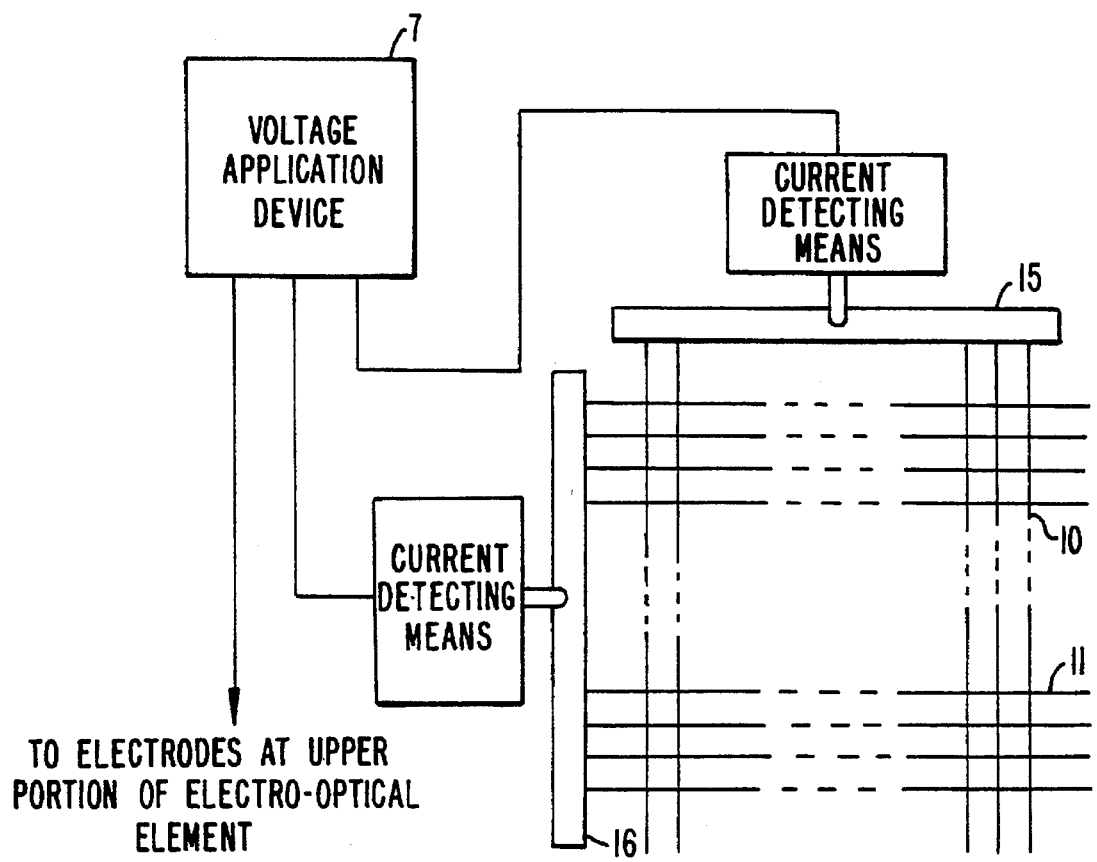
FIG. 4 shows the construction of one example voltage application device.

FIG. 4 further shows two probes extending from two terminals on voltage source 7 capable of outputting pulse voltages of ±15 V which are in electrical contact with each shorting bar, 15 and 16, via two current detecting devices, one installed on the gate side and the other on the source side.

Connection is also made to the thin film transparent electrode 2a at the upper portion of the electro-optical element from another terminal which is capable of applying a constant voltage.

Figure 5:
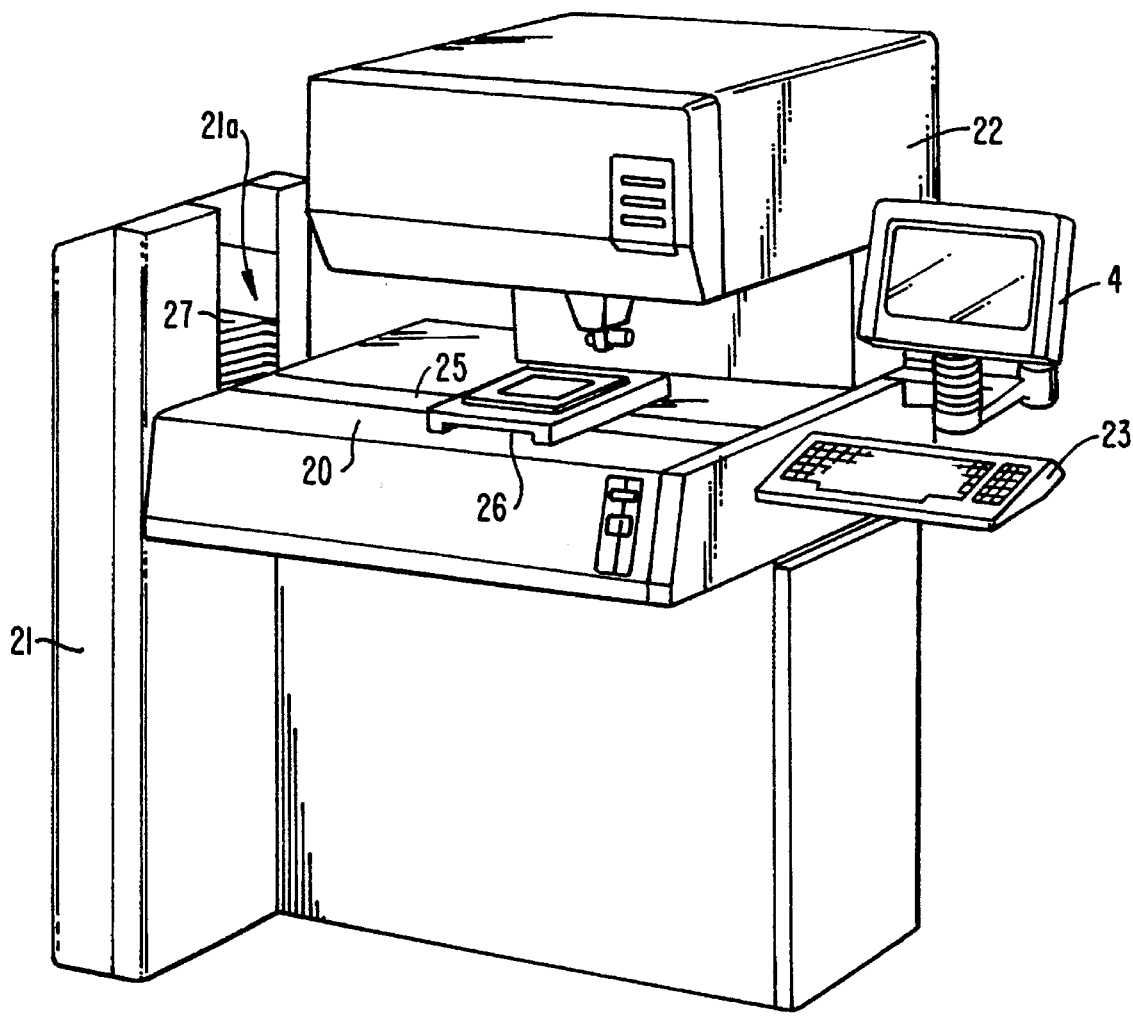
FIG. 5 shows the overall configuration of said testing instrument.
Figure 6:
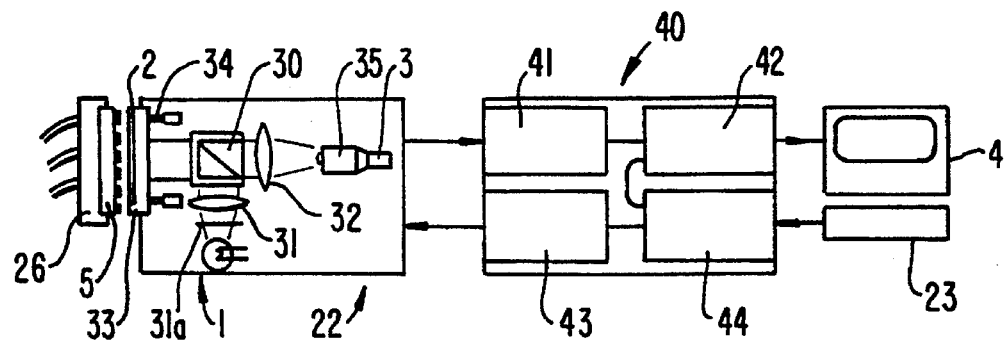
FIG. 6 shows the internal construction of the testing head of said testing instrument.
Figure 7:
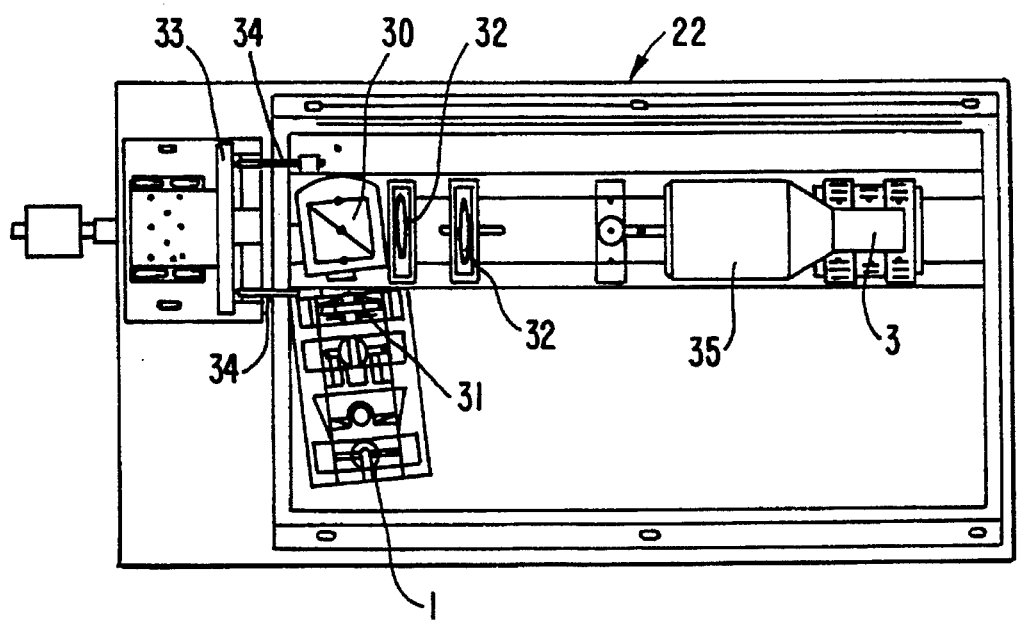
FIG. 7 is a more detailed diagram of the testing head.

FIGS. 5–7 present the detailed construction of the testing instrument whose construction is outlined in FIG. 2. In FIG. 5, number 20 indicates a test bed, number 21 a base plate storage rack (cassette rack) located to the left side of test bed 20. Number 22 is a testing head, and number 23 indicates a control panel.

Guide rails 25 are located lengthwise on top and in the center of test bed 20, providing table 26 with the lengthwise movement along guide rails 25. In addition, a mechanism is installed underneath table 26 to allow table 26 to move perpendicularly with respect to guide rails 25, and therefore table 26 is capable of moving lengthwise as well as widthwise (or in X and Y directions) on the top plane of bed 20.

Base plate storage 21 accommodates cassettes 27 which further contain multiple active matrix liquid crystal display base plates 5. Active matrix liquid crystal display base plates 5 can be retrieved in sequence from the opening of cassette 27 situated at the top of the base plate storage 21 and placed on table 26.

The details of the internal structure of test head 22 are shown in FIG. 6 and FIG. 7. The order of arrangement for the optical equipment in FIG. 2, FIG. 6, and FIG. 7, however, can be changed to suit the location or the direction of orientation of the liquid crystal panels. Furthermore, FIG. 2, FIG. 6, and FIG. 7 show an example of a vertical arrangement of the panels for easier explanation.

Inside test head 22 shown in FIG. 5 are light source 1 and photo-receiver 3, etc. as indicated by FIG. 2. Light source 1 and photo-receiver 3 are directed towards beam splitter 30 respectively. Installed in between beam splitter 30 and light source 1 are reflective mirror 31A, adjusting lens 31, and filter 31a. Adjusting lens 32 is located between beam splitter 30 and photo-receiver 3.

On the left side of beam splitter 30 in FIG. 2 is holder 33 equipped with electro-optical element 2. Holder 33 can be adjusted with respect to liquid crystal display base plate 5 by support shaft 34. In addition, photo-receiver 3 is equipped with zoom lens 35, allowing effective entry of light reflected by electro-optical element 2 into the photo-receivers.

This construction allows the detecting beam emitted by light source 1 to enter the upper portion of electro-optical element 2 at a right angle, to be reflected by optically reflective part 9 within electro-optical element 2, then to enter photo-receiver 3 through beam splitter 30, lens 32, and zoom lens 35.

Filter 31a is a device to convert the detecting beam emitted by halogen light 1 into a red color beam. More specifically, it is a filter which selectively allows passage of light whose wavelength is near that of red, from the detecting beam of various wavelengths. Use of a detecting beam chiefly consisting of a red color is more favorable as a detecting beam because the electro-optical element 2 is sensitive to red, and reacts well to red light and changes the light transmissivity more readily when irradiated with red light. At the same time the CCD camera is readily reactive to the color red. Additionally, use of a heat insulating filter will eliminate the infrared rays emitted by halogen light 1, protecting electro-optical element from damage.

Light guide B is a rectangular parallelopiped transparent vessel 30A made of glass or other material with translucent mirror 30B installed along the diagonal line of the sides of transparent vessel 30A. Side 30a of transparent vessel 30A on the side of photo-receiver 3 is angled with respect to a plane perpendicular to the optical axis. Providing transparent vessel 30A with an angle can prevent the reflected light at side 30a of transparent vessel 30A on the side of photo-receiver 3 that is likely to enter photo-receiver 3 from entering into photo-receiver 3 by blocking it out at diaphragm 36 after it is collected by lens 32.

In FIG. 6, number 40 is a controller which contains analog to digital (A/D) converter 41 which is electrically connected to photo-receiver 3, image processor 42, drive circuit 43, and CPU 44. Image processor 42 is connected to display 4 whereas CPU 44 is connected to control panel 23.

Controller 40 converts the intensity of light received by photo-receiver 3 into equivalent voltage, displays it, and displays on monitor 4 the number of defects, their location, and the type of defects of active matrix liquid crystal display base plate 5 according to the level of the voltage equivalent. The number of defects can be displayed by entering the dimensions of one pixel element, masking the voltage equivalent distribution, resolving the difference, and evaluating the result.

Figure 8:
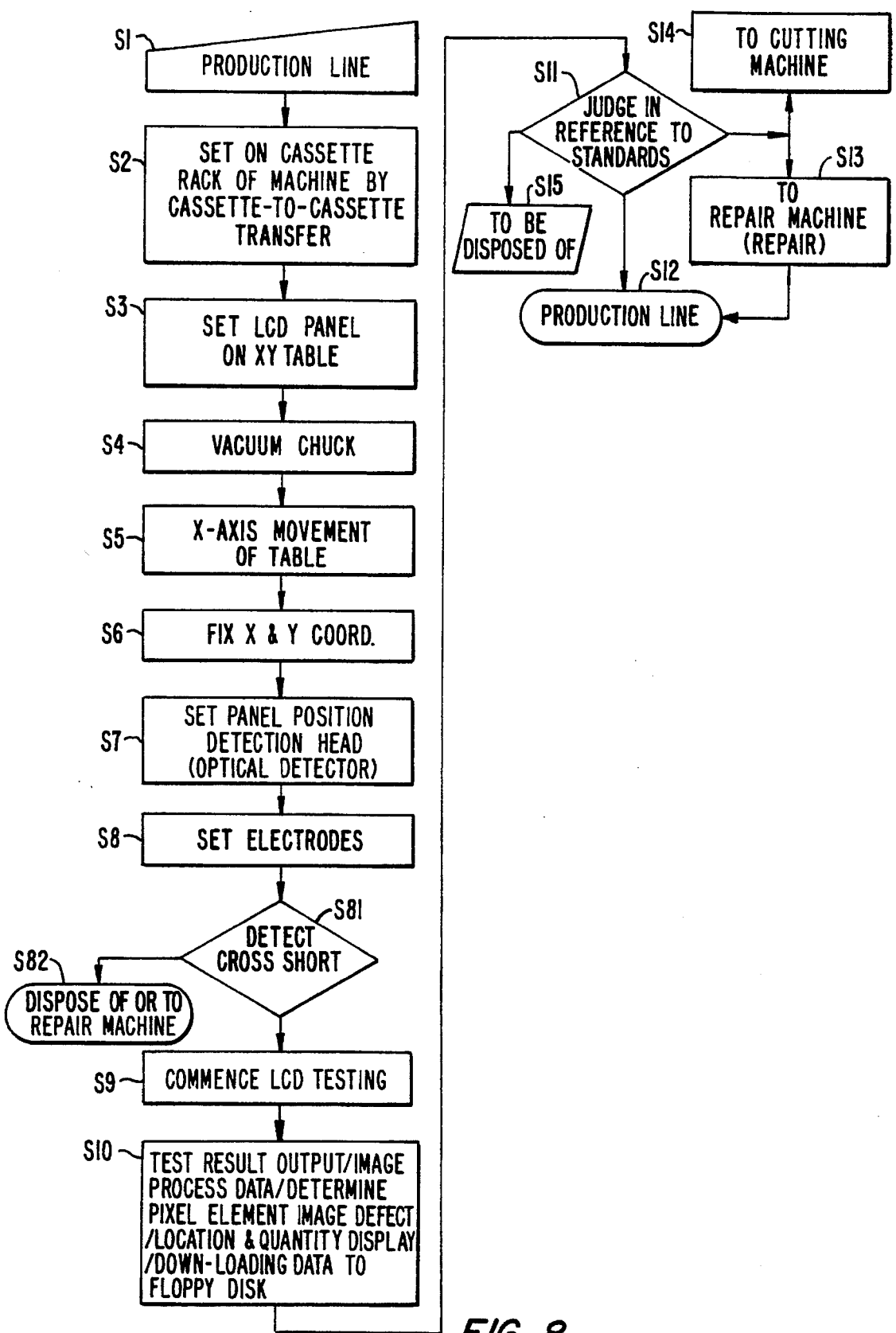
FIG. 8 is a flow chart showing one example of the operating procedure.

The flow chart shown in FIG. 8 explains the testing sequence, utilizing the testing device as applied to liquid crystal display base plates 5.

The production line for liquid crystal display base plate 5 includes among other processes, mask production, thin film production, applying photoresist, exposing the base plate to light, etching, rinsing, ion implantation and others in order to form source leads 10, gate leads 11, pixel element electrodes 13, switching elements 14, and shorting bars 15 and 16 on the base plate, thus producing liquid crystal display base plate 5. This production line is step S1 as indicated by FIG. 8.

Liquid crystal display base plate 5 in this example has a plurality (4 in this example) of square areas comprising source leads 10, gate leads 11, pixel element electrodes 13, switching elements 14, and shorting bars 15 and 16 on one base plate.

In step S2, liquid crystal display base plate 5 produced in step S1 is transferred while being kept in the cassette to base plate storage area 21 of the testing instrument.

In step S3, liquid crystal display base plate 5 stored in base plate storage area 21 is retrieved from base plate storage 21 and placed on table 26.

When liquid crystal display base plate 5 is placed on table 26 in step S4, liquid crystal display base plate 5 is secured to table 26 by vacuum chuck or other suitable means.

In step S5, table 26 is moved along guide rail 25 (X axis movement) to scanning head 22. Next, in step S6, table 26 is given a fine adjustment in X and Y directions to correctly position liquid crystal display base plate 5 at a predetermined location under scanning head 2.

In step S7, electro-optical element 2 is brought closer to the active matrix liquid crystal display base plate 5 by moving holder 33 which is installed on scanning head 22. In this operation, liquid crystal display base plate 5 must be positioned as closely as possible to the electro-optical element. This positioning should bring liquid crystal display base plate 5 parallel to electro-optical element 2.

In step S8, the electrodes of voltage application device 7 are connected to shorting bars 15 and 16 of active matrix liquid crystal display base plate 5.

In step S81, voltage on the source side is gradually increased to become a positive voltage with respect to the gate side while monitoring the leakage current between source leads 10 and gate leads 11 by way of a current detecting device. Detection of leakage current means a short-circuit (called cross short) between source leads 10 and gate leads 11. If there is no leakage current detected, step S9 will then be executed. If a cross short is detected, active matrix liquid crystal display base plate 5 should either be repaired by the repairing device in step S81 or disposed of.

In step S9, a bias voltage is applied between the pre-wired electrodes at the upper portion of the electro-optical elements and the electrodes connected to the gate and the source sides in step S9. The bias voltage should be AC or DC of a maximum of several volts in relation to the reference voltage (such as ground), and applied in an appropriate mode for defect testing. This operation generates an electric field between thin film transparent electrode 2a at the upper portion of the electro-optical element and the pixel element electrodes on active matrix liquid crystal display base plate 5. If optically reflective part 9 formed on the bottom of electro-optical element 2 is of dielectric multilayer film, optically reflective part 9 will not affect the electric field. If optically reflective part 9 is made of metal such as aluminum (A1), it may affect the electric field of electro-optical element 2, adversely effecting testing accuracy.

Figure 9:
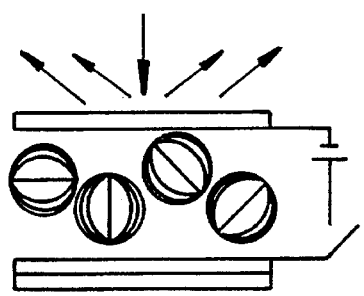
FIG. 9 shows a cross-section of a liquid crystal sheet without electric field applied.
Figure 10:
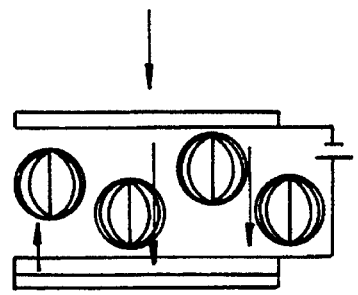
FIG. 10 shows a cross-section of a liquid crystal sheet with an electric field applied.

When the previously described liquid crystal sheet is used as electro-optical element 2, the droplet liquid crystal molecules are disoriented as shown in FIG. 9 when no electrical field is present, and incident light is dispersed, thus preventing light from passing through the liquid crystal sheet. When an electrical field is applied as shown in FIG. 10, the liquid crystal molecules within the droplets become oriented and allow light to pass through the liquid crystal sheet. The transparent electrode has a field that changes linearly as voltage to the polymer dispersion type liquid crystal changes. Utilizing this linear function, changes in the voltage can be observed as the changes in the amount of transmitted light.

A bias voltage corresponding to the linear field is applied in between pixel element electrodes 13 and thin layer transparent electrode 2a at the upper portion of electro-optical element 2.

As described above, with liquid crystal sheet 8, application of voltage in between said pixel element electrodes 13 and thin film transparent electrode 2a at the upper portion of electro-optical element 2 generates an electric field. Changes made by each pixel element electrode 13 in the electrical field cause changes in the light transmissivity of electro-optical element 2.

In step S9, the detecting beam from light source 1 is irradiated through light guide B onto electro-optical element 2 where it is reflected by optically reflective part 9 through electro-optical element 2 again and into photo-receiver 3, where the intensity of the reflected light is measured. Light guide B guides the detecting beam onto the top surface of electro-optical element 2 at a right angle to the electro-optical element. The direction of light transmissivity of the liquid crystal molecules inside electro-optical element 2 is the thickness direction of electro-optical element 2, the transmissivity being proportional to both the thickness of the electro-optical element and the direction of crystal module orientation, as established by the electric field. It is of particular importance to guide the detecting beam by light guide B perpendicularly onto the top surface of electro-optical element 2.

In step S10, controller 40 computes the light received by photo-receiver 3 to produce the voltage equivalents. When the values of the voltage equivalents are identified, voltage equivalents generated at each pixel element are checked in reference to the threshold value. In step S11 the quality of the pixel element is determined by the brightness of the image or by the voltage equivalents. To determine acceptance or rejection of active matrix liquid crystal display base plate 5, a standard needs to be used. If a certain value of permissible number of defects for a liquid crystal display element of 1,000,000 pixel elements is predetermined, a user is able to judge acceptance or rejection of active matrix liquid crystal display base plate 5 by the data of the processed image.

When the voltage equivalents obtained from each pixel element electrode via photo-receiver 3 show irregularities, judgement decisions regarding acceptance or rejection will be made as follows:

FIG. 1(a), FIG. 11(a), FIG. 12(a), and FIG. 13(a) show various states on the voltage equivalents in relation to the contrast of the pixel elements. Each figure indicates the voltage equivalents obtained from each pixel element via photo-receiver 3 by colors in the order of high voltage to low voltage, wherein darker colors indicate high pixel element voltage and lighter colors low pixel element voltage. Each figure is indicating each model with the pixel elements which have mixed voltage levels. FIG. 1(b), FIG. 11(b), FIG. 12(b), and FIG. 13(b) show the relationship between the pixel element voltage and its quantities, or the pixel element voltage distribution. In each figure, the darkest color indicates the normal pixel element of which the voltage level, or the VS level is shown by the alternate long and short dash line.

Figure 11A:
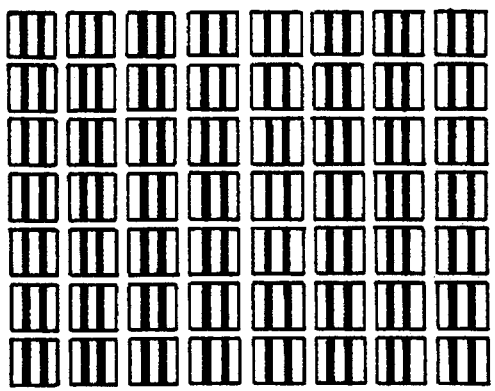
FIG. 11(a) is a diagram showing the second example of the brightness of the pixel element electrode to be tested by the testing method of this invention.
Figure 11B:
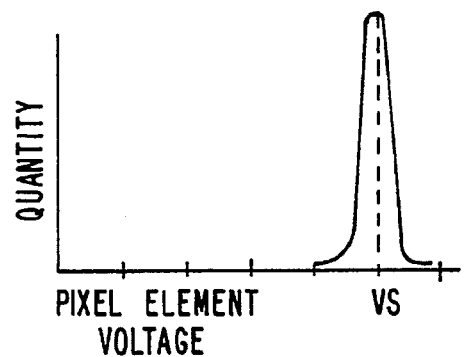
FIG. 11(b) is a voltage distribution graph which corresponds to the pixel element electrode shown in FIG. 11(a)
Figure 12A:
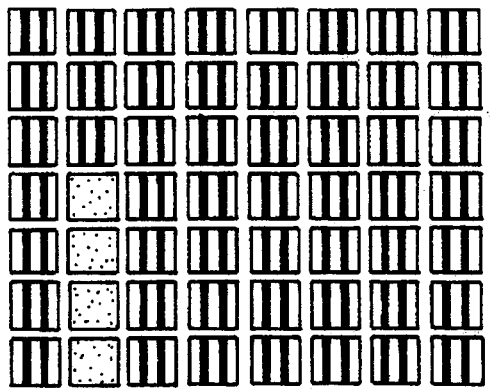
FIG. 12(a) is a diagram showing the third example of the brightness of the pixel element electrode to be tested by the testing method of this invention.
Figure 12B:
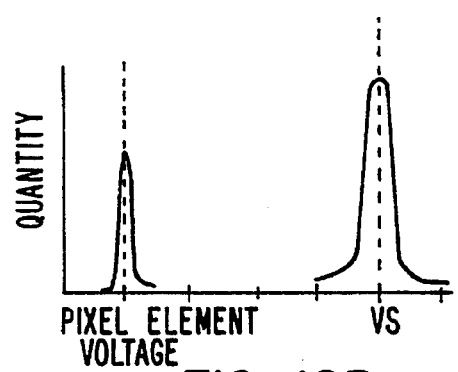
FIG. 12(b) is a voltage distribution graph which corresponds to the pixel element electrode shown in FIG. 12(a)
Figure 13A:
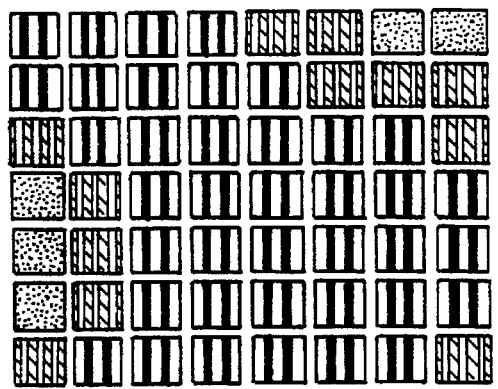
FIG. 13(a) is a diagram showing the fourth example of the brightness of the pixel element electrode to be tested by the testing method of this invention.

FIG. 1(a) shows a model with various display voltage irregularities, exhibiting the pixel element voltages of multiple levels other than the VS level. FIG. 11 (a) shows a model with no abnormal pixel element at all, in the case of which the pixel element voltage distribution exhibits concentration of the peaks-at the VS level as shown in FIG. 11(b). FIG. 12(a) shows a model with abnormality in the lower four pixel elements in the second column from left, exhibiting the peak of the pixel element voltage other than one at the VS level. FIG. 13(a) shows a model with various color irregularities, exhibiting the pixel element voltages of multiple levels other than the VS level.

Figure 14:
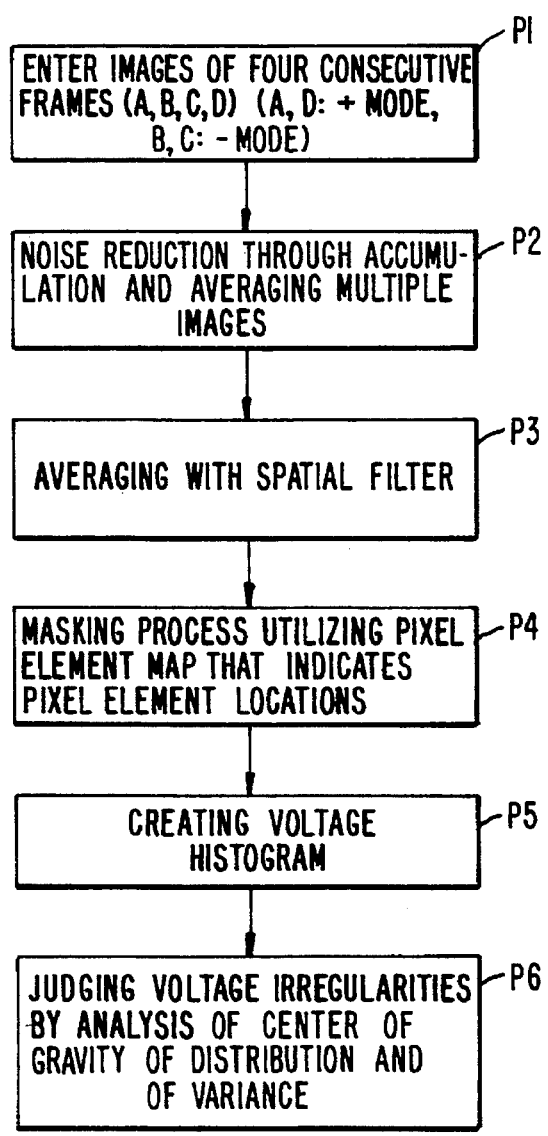
FIG. 14 is a flow chart for testing the brightness of the pixel element electrode.

FIG. 14 shows a flow chart of a sample testing of liquid crystal display base plate 5 by its voltage distribution.

In step P1, four kinds of the images of a liquid crystal display base plate are input in sequence. In step P2, these are accumulated and averaged to reduce noise. The measurement in step P1 is repeated several times, and the image data for each measurement is added to the image memory. The accumulated data is then divided by the number of measurements taken for averaging, thus reducing the noise of the equipment itself. Step P1 mode is the spatial pattern to be applied to a liquid crystal display and the pattern is exactly reversed between the + and − modes. In FIG. 14, a liquid crystal display is driven in the + mode for A and C and in the − mode for B and D to gather four kinds of images. Defective pixel elements are detected by comparing A to B and C to D, whereas comparison between A and C and between B and D will eliminate the drift and other error factors of the equipment.

In step P4, the masking process is conducted utilizing the pixel element map which shows the locations of the pixel elements. The masking process is a process with which to judge which area of the image corresponds to actual pixel elements. The pixel element map in turn, will identify the location on the liquid crystal display that corresponds to the pixel element identified by the masking process. These processes relate each pixel element to its voltage level.

In step P5, a voltage histogram is created by the image processing device to create the pixel element voltage distribution.

Figure 13B:
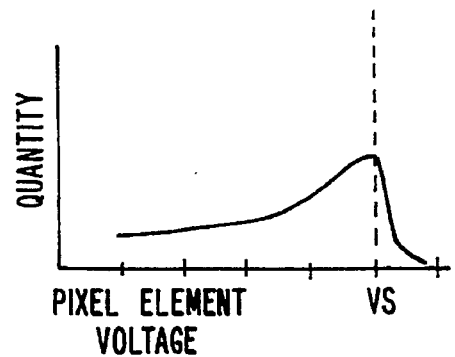
FIG. 13(b) is a voltage distribution graph which corresponds to the pixel element electrode shown in FIG. 13(a)

In step P6, the location of the center of gravity in the pixel element voltage distribution is analyzed. By analysis of the variance, the voltage irregularity is judged. In FIG. 13(b), for example, discrepancy in the locations of the voltage VS which is supposed to be applied to the pixel elements, and of the voltage histogram's center of gravity indicates a display irregularity defect. Such judgement may be made by comparing the variance in the histogram distribution to that of a properly operating device.

As described above, if the pixel element voltage distribution shown in FIG. 11 is considered normal and all others abnormal, liquid crystal display base plate 5 can be determined good or bad by display irregularity with respect to the ideal.

In making a judgement of good or bad on liquid crystal display base plate 5 can be made by analyzing and detecting the center of gravity of the pixel element voltage distribution and determining the deviation thereof. In other words, if the magnitude of allowable deviation in the center of gravity of the pixel element voltage in reference to the VS level is predetermined, detection of the location of the center of gravity will determine if liquid crystal display base plate is good or bad.

In step S12, when the number of defects on active matrix liquid crystal display base plate is within the allowable range, active matrix liquid crystal display base plate 5 completing the test is transferred to the next production line.

An active matrix liquid crystal display base plate 5 whose defects exceeded the permissible range, if reparable, are sent to the repair machine in step S13 or to the cutting and the depositing machines in step S14 for repair. Upon repairing, it can be returned to the production line in step S12.

Active matrix liquid crystal displays deemed irreparable in step S11 are disposed of in step S15.

This invention closely approximates the conventional final inspection of a liquid crystal panel, but occurs before assembly while the product is in the form of an active matrix liquid crystal display base plate 5. Because testing occurs before liquid crystal panel assembly, repair of the defects is relatively easy and the defective base plates are not sent to the subsequent processes. This is beneficial for improved in-line yield. Even if the pixel element electrode itself is functional but showing color irregularity of the pixel element, decisions regarding whether it is a good or bad pixel element can be made by generating the pixel element voltage distribution and checking the status and the center of gravity thereof.

Application of this invention enables testing of various defects and handing of products while retaining static electricity protection in place. Static electricity protection is thus maintained throughout the liquid crystal panel assembly process where static electricity is most likely to occur.

The testing instrument of this invention is versatile in its application. It can test base plates with driver IC's installed in place of the shorting electrodes, base plates with driver circuits installed, base plates with driver circuits, and those base plates without the shorting electrodes.

In addition, the electro-optical elements can be established free of dimensional limitations of the pixel elements on the active matrix liquid crystal display base plates to be tested, and is versatile, highly reliable, and inexpensive to build.

Testing active matrix liquid crystal display base plate 5 can be made easier because this testing instrument will electrically display the locations, number, and the type of defects on active matrix liquid crystal display base plate 5.

Furthermore, this testing instrument converts the reflected light from electro-optical element 2 all together into their equivalent voltages for the judgement of defects, providing swift testing in a short period of time. For instance, when the inventors conducted a test on 1011 active matrix liquid crystal display using a prototype testing instrument that utilized a liquid crystal sheet as an electro-optical element, the resolution of the liquid crystal sheet was less than 50 micrometers and the test was carried out at a rate of over 12 base plates per hour including the handling (including mechanical rate-determining) of active matrix liquid crystal display base plate 5.

Since light guide B guides the detecting beam from light source 1 perpendicularly onto the upper portion of electro-optical element 2, if liquid crystal is used as electro-optical element 2, the liquid crystal will either permit or prevent the passage of the detecting beam efficiently at high resolution, thus raising the resolution during the detecting process to a sufficiently high level.

However, an increase in the number of the base plates to be processed can be readily achieved by adding photo-receiver 3 (CCD camera) thereby enabling a test on multiple active matrix liquid crystal display base plates 5 at one time.

In this invention an electro-optical element is placed over and facing an active matrix liquid crystal display base plate to be tested. The pixel element electrodes on the active matrix liquid crystal display base plate are energized to change the optical properties of the electro-optical element. The changes in the light which passes through such electro-optical element are captured by a photo-receiver, and the pixel element voltage distribution is compared to determine a good or a bad active matrix liquid crystal display base plate. Therefore, this testing method not only judges whether or not a pixel element electrode is functional, but also detects any functional irregularities in a functional pixel element electrode, offering a more accurate and complete testing of liquid crystal display base plates.

What is claimed is:

1. A computer aided apparatus for testing a liquid crystal display base plate comprising:

means for applying a predetermined voltage to the gate or base leads of the pixel elements located on the liquid crystal display plate under test;

means for applying a predetermined voltage to the source or supply leads of the pixel elements located on the liquid crystal display base plate under test;

means for irradiating the liquid crystal display base plate with a beam of light, said beam of light being coherent and uniform;

means for modulating said beam of light, the magnitude of said modulation being proportional to the voltage appearing on the gate or base lead and/or source or supply lead;

means for directing said beam of light to and from said modulation means; and means for measuring the intensity of said beam of light after it has been modulated by said modulation means.

2. A computer aided apparatus as described in claim 1 and further comprising means for averaging the results of several intensity readings of the liquid crystal display base plate under test;

means for comparing the raw data or average results generated by the liquid crystal display base plate under test with the stored results of a similar test of an ideal, known functional liquid crystal display base plate; and means for evaluating the difference between the liquid crystal display base plate under test and the ideal, known functional liquid crystal display base plate.

3. A computer aided apparatus as described in claim 2 in which the comparison between the liquid crystal display base plate under test and [said] the known, functional liquid crystal display base plate is accomplished by comparing the mean of the pixel element voltage, VS, of the two base plates.

4. A computer aided apparatus as described in claim 1 and further including means for isolating the particular defective pixel or pixels, if any, on the liquid crystal display base plate under test.

5. A computer aided apparatus as described in claim 1 and further including means for physically sorting and separating acceptable liquid crystal display base plates from liquid crystal display base plates requiring an acceptable amount of rework or repair, and further separating those liquid crystal display base plate having an excessive number of defects such that they do not warrant rework or repair, but are to be discarded.

6. A computer aided apparatus as described in claim 1 in which said modulation means comprises an electro-optical element.

7. A computer aided apparatus as described in claim 1 wherein said directing means comprises a light guide.

8. A computer aided apparatus as described in claim 7 wherein said directing means comprises a lens.

9. A computer aided apparatus as described in claim 8 wherein said directing means comprises a mirror.

10. A computer aided apparatus as described in claim 8 or 3 further comprising:

a bed comprising a surface;

a base including a substantially flat top surface for supporting the liquid crystal display base plate under test, said base being operably coupled on a guide to move lengthwise across said surface, said base being operably coupled to a mechanism to move widthwise across said surface; and a head housing said irradiating means, said modulation means, and said directing means, said head being mounted on said bed;

wherein said base is positioned at a predetermined location so that the liquid crystal display base plate under test is substantially under and parallel to said modulation means.

11. A computer aided apparatus as described in claim 10 wherein said head includes a scanning means with a moving holder for moving said modulation means as close and as parallel as possible to the liquid crystal display base plate under test without damaging the liquid crystal display base plate or said modulation means.

12. A computer aided apparatus as described in claim 10 further comprising a rack having a plurality of slots, said rack located proximate to said bed to facilitate transfer of a liquid crystal display base plate under test from a slot to said base.

13. A computer aided apparatus as described in claim 10 wherein said head is coupled to said measuring means.

14. A computer aided apparatus as described in claim 1 or 3 wherein said measuring means measures the intensity of said beam of light in terms of an equivalent voltage.

15. A computer aided apparatus for testing an active matrix liquid crystal display base plate, said active matrix liquid crystal display base plate being a partially completed active matrix liquid crystal display panel, said apparatus comprising:

a lighting device for emitting a beam of light, said beam of light being uniform and coherent;

a light guide having a beam splitter, said light guide being positioned to receive said beam of light from said lighting device;

an electro-optical element having a first surface facing said light guide and a second surface opposite said first surface, said second surface having an optically reflective coating;

a thin transparent electrode at an upper part of said electro-optical element;

a voltage source coupled to said thin transparent electrode and to the source or supply leads and/or to the gate or base leads of an active matrix liquid crystal display base plate under test, the active matrix liquid crystal display base plate positioned in close proximity to said second surface of said electro-optical element with a gap therebetween;

an imaging device positioned to receive said beam of light after said beam of light has been modulated and then exited said light guide; and a controller coupled to said imaging device and to a computer including a monitor, said controller converting the intensity of said beam of light received by said imaging device into an equivalent voltage and displaying on said monitor the number, location, and types of defects of the active matrix liquid crystal display base plate under test according to the level of the voltage equivalent.

16. A computer aided apparatus as described in claim 15 and further comprising:

a bed comprising a surface;

a base including a substantially flat top surface for supporting the active matrix liquid crystal display base plate under test, said base being operably coupled on a guide to move lengthwise across said surface, said base being operably coupled to a mechanism to move widthwise across said surface; and a head housing at least said lighting device, said light guide, said electro-optical element, and said imaging device, said head being mounted on said bed;

wherein said base is positioned at a predetermined location so that the active matrix liquid crystal display base plate under test is substantially under and parallel to said electro-optical element.

17. A computer aided apparatus as described in claim 15 wherein said base is positioned so that the active matrix liquid crystal display base plate under test is substantially under and parallel to said electro-optical element at a predetermined location.

18. A computer aided apparatus as described in claim 17 wherein said head includes a scanning head with a moving holder for moving said electro-optical element as close and as parallel as possible to the active matrix liquid crystal display base plate under test without damaging the active matrix liquid crystal display base plate or said electro-optical element.

19. A computer aided apparatus as described in claim 18 further comprising a rack having a plurality of slots, said rack located proximate to said bed to facilitate transfer of the active matrix liquid crystal display base plate under test from a slot to said base.

* * * * *